United States Patent
Lee et al.

(10) Patent No.: US 11,665,909 B2
(45) Date of Patent: May 30, 2023

(54) FERAM WITH LAMINATED FERROELECTRIC FILM AND METHOD FORMING SAME

(71) Applicant: Taiwan Semiconductor Manufacturing Co., Ltd., Hsinchu (TW)

(72) Inventors: Bi-Shen Lee, Hsinchu (TW); Yi Yang Wei, Hsinchu (TW); Hsing-Lien Lin, Hsinchu (TW); Hsun-Chung Kuang, Hsinchu (TW); Cheng-Yuan Tsai, Chu-Pei (TW); Hai-Dang Trinh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/125,091

(22) Filed: Dec. 17, 2020

(65) Prior Publication Data
US 2022/0028874 A1    Jan. 27, 2022

Related U.S. Application Data

(60) Provisional application No. 63/055,379, filed on Jul. 23, 2020.

(51) Int. Cl.
*H01L 21/00* (2006.01)
*H01L 27/11507* (2017.01)
*H01L 49/02* (2006.01)

(52) U.S. Cl.
CPC ........ *H01L 27/11507* (2013.01); *H01L 28/60* (2013.01)

(58) Field of Classification Search
CPC ........................ H01L 27/11507; H01L 28/60
See application file for complete search history.

(56) References Cited

U.S. PATENT DOCUMENTS

| | | | |
|---|---|---|---|
| 6,153,898 A | 11/2000 | Wantanabe et al. | |
| 7,349,195 B2 | 3/2008 | Baniecki et al. | |
| 2003/0102500 A1 | 6/2003 | Cross | |
| 2009/0127603 A1* | 5/2009 | Yamakawa | H01L 27/11502 257/E27.113 |

(Continued)

FOREIGN PATENT DOCUMENTS

| | | |
|---|---|---|
| JP | 20032382717 A | 10/2003 |
| KR | 19990005439 A | 1/1999 |

(Continued)

*Primary Examiner* — Richard A Booth
(74) *Attorney, Agent, or Firm* — Slater Matsil, LLP

(57) ABSTRACT

A method includes forming a bottom electrode layer, and depositing a first ferroelectric layer over the bottom electrode layer. The first ferroelectric layer is amorphous. A second ferroelectric layer is deposited over the first ferroelectric layer, and the second ferroelectric layer has a polycrystalline structure. The method further includes depositing a third ferroelectric layer over the second ferroelectric layer, with the third ferroelectric layer being amorphous, depositing a top electrode layer over the third ferroelectric layer, and patterning the top electrode layer, the third ferroelectric layer, the second ferroelectric layer, the first ferroelectric layer, and the bottom electrode layer to form a Ferroelectric Random Access Memory cell.

20 Claims, 14 Drawing Sheets

(56) References Cited

U.S. PATENT DOCUMENTS

| | | | | |
|---|---|---|---|---|
| 2019/0057860 A1* | 2/2019 | Yoon | ............... | H01L 29/78391 |
| 2019/0193851 A1* | 6/2019 | Alfano | ................. | B64C 11/18 |
| 2019/0304986 A1* | 10/2019 | Dong | ............... | H01L 27/1159 |
| 2020/0176610 A1* | 6/2020 | Lee | .................... | H01L 29/517 |

FOREIGN PATENT DOCUMENTS

| | | |
|---|---|---|
| KR | 20190119203 A | 10/2019 |
| KR | 20200071852 A | 6/2020 |

* cited by examiner

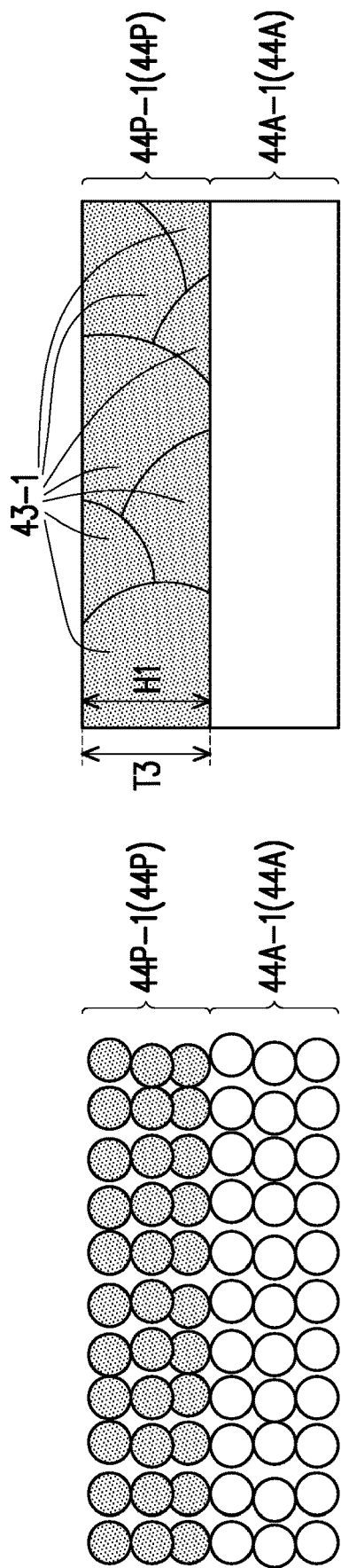

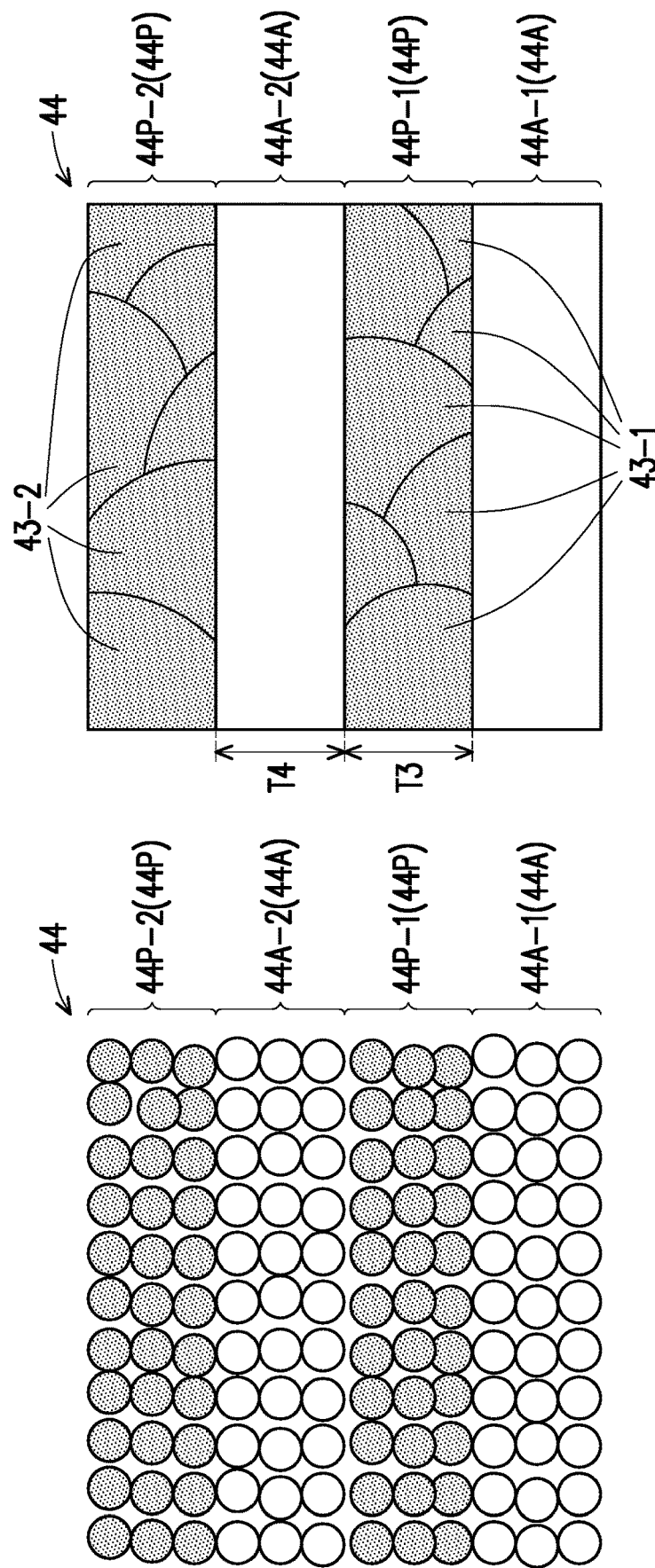

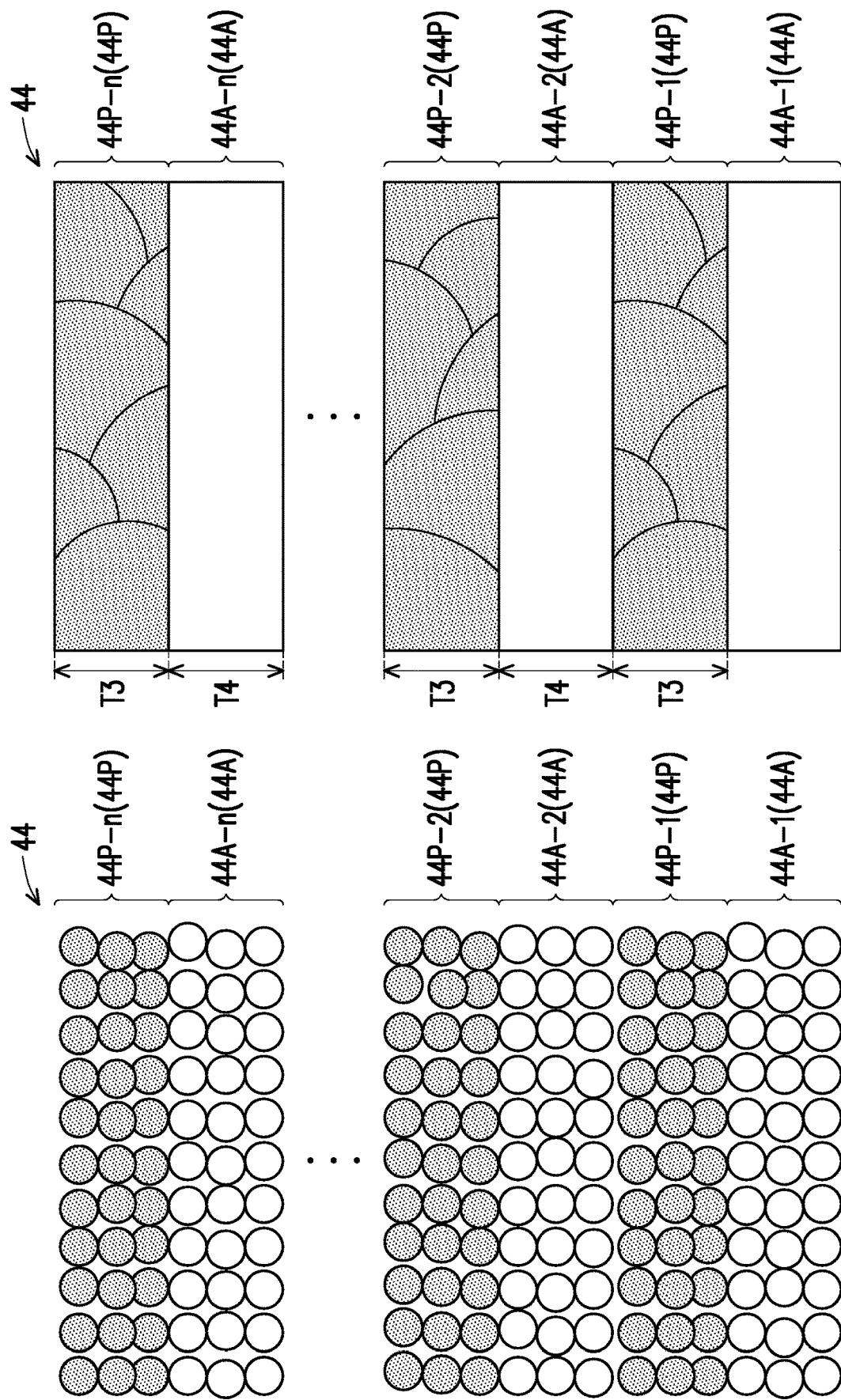

FERAM WITH LAMINATED FERROELECTRIC FILM AND METHOD FORMING SAME

PRIORITY CLAIM AND CROSS-REFERENCE

This application claims the benefit of the U.S. Provisional Application No. 63/055,379, filed Jul. 23, 2020, and entitled "Laminated HiK film to improve Ferroelectricity of FeRAM," which application is hereby incorporated herein by reference.

BACKGROUND

Ferroelectric Random Access Memory (FeRAM) is a memory device that uses a ferroelectric layer to store state ("0" or "1"). Binary "0"s and "1"s are stored as one of two possible electric polarizations in each data storage cell.

The writing of a FeRAM cell is accomplished by applying a field across the ferroelectric layer to charge the electrodes on either side of the ferroelectric layer, forcing the atoms inside the ferroelectric layer into the "up" or "down" orientation (depending on the polarity of the charge), thereby storing a "1" or "0".

In a reading operation of a FeRAM cell, the FeRAM cell is forced into a selected state, for example, "0". If the cell already held a "0", no pulse will be generated. If the FeRAM cell held a "1", the re-orientation of the atoms in the ferroelectric layer will cause a brief pulse of current. The presence of this pulse means the cell held a "1". Since this process overwrites the cell, reading FeRAM is a destructive process, and requires the cell to be re-written.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A, 7B, 8A, 8B, 9A, 9B, 10A, and 10B illustrate the cross-sectional views of intermediate stages in the formation of a laminated ferroelectric layer including two alternating layers in accordance with some embodiments.

DETAILED DESCRIPTION

Figure 1:
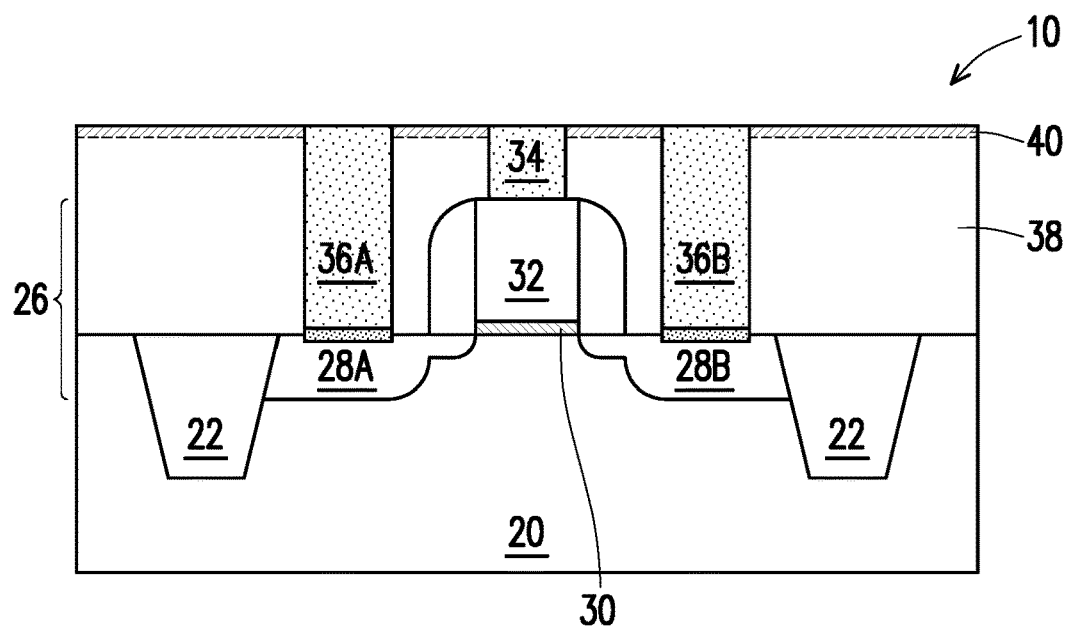
FIGS. 1 through 6 illustrate the cross-sectional views of intermediate stages in the formation of a Ferroelectric Random Access Memory (FeRAM) cell including a laminated ferroelectric layer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Ferroelectric Random Access Memory (FeRAM) cell including a laminated ferroelectric layer and the method of forming the same are provided. In accordance with some embodiments of the present disclosure, the laminated ferroelectric layer includes a first ferroelectric layer having a first crystallization temperature and a second ferroelectric layer having a second crystallization temperature lower than the first crystallization temperature. The formation of the first ferroelectric layer and the second ferroelectric layer may be repeated. The second ferroelectric layer may have a polycrystalline structure, and the grain size of the second ferroelectric layer is limited by the thickness of the second ferroelectric layer. The performance of the FeRAM cell is thus improved. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 6 illustrate the cross-sectional views of intermediate stages in the formation of a FeRAM cell in accordance with some embodiments of the present disclosure. The illustrated FeRAM cell may be a part of a FeRAM array, which includes a plurality of FeRAM cells arranged as a plurality of rows and columns. The corresponding processes are also reflected schematically in the process flow shown in FIG. 16.

Referring to FIG. 1, wafer 10 is formed. Wafer 10 may include a plurality of identical device dies therein. In accordance with some embodiments of the present disclosure, wafer 10 includes semiconductor substrate 20 and the features formed at a surface of semiconductor substrate 20.

Semiconductor substrate 20 may be formed of or comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like. Semiconductor substrate 20 may also be a bulk semiconductor substrate or a Semiconductor-On-Insulator (SOI) substrate. Shallow Trench Isolation (STI) regions 22 may be formed in semiconductor substrate 20 to isolate different regions and devices in semiconductor substrate 20.

In accordance with some embodiments of the present disclosure, wafer 10 includes integrated circuit devices, which are formed at the top surface of semiconductor substrate 20. The integrated circuit devices may include Complementary Metal-Oxide Semiconductor (CMOS) transistors, resistors, capacitors, diodes, and/or the like in accordance with some embodiments.

The integrated circuit devices may include transistor 26, which includes source/drain regions 28A and 28B. Gate dielectric 30 is formed over substrate 24. In accordance with some embodiments, gate dielectric 30 comprises silicon oxide, a high-k dielectric material such as $HfO_2$, $La_2O_3$, or the like, or composite layers thereof. Gate electrode 32 is formed over gate dielectric 30. Gate electrode 32 may be formed of polysilicon, a metal, a metal alloy, or the like. Gate contact plug 34 and source/drain contact plugs 36A and 36B are formed to electrically connect to gate electrode 32 and source/drain region 28A and 28B. Gate dielectric 30, gate electrode 32, gate contact plug 34, and source/drain contact plugs 36A and 36B are in inter-layer dielectric 38. In accordance with some embodiments, inter-layer dielectric 38 comprises silicon oxide, phospho silicate glass (PSG), boro-silicate glass (BSG), boron-doped phospho silicate glass (BPSG), fluorine doped silicate glass (FSG), or the like. There may be (or may not be) an etch stop layer 40 formed. Etch stop layer 40 may be used for the patterning of FeRAM layers in order to form FeRAMs. Etch stop layer 40 is illustrated using dashed lines to indicate that it may or may not be formed. In accordance with some embodiments, etch stop layer 40 is formed of a dielectric material such as silicon nitride, silicon oxide, silicon oxynitride, or the like.

FIGS. 2 through 5 illustrate the intermediate stages in the formation of a FeRAM cell 50 (FIG. 5) in accordance with some embodiments. It is appreciated that although the subsequent figures illustrate that the formed FeRAM cell 50 is directly over inter-layer dielectric 38, FeRAM cell 50 may be formed in any layer higher than or lower than inter-layer dielectric 38 also. For example, FeRAM cell 50 may be formed in an inter-Metal Dielectric (IMD), which is in an interconnect structure over inter-layer dielectric 38. Metal lines and vias may be formed in the interconnect structure, and some of metal lines and vias may be formed at in the same dielectric layer in which FeRAM cell 50 is formed. The IMD may be formed of a low-k dielectric material. The FeRAM cell 50 may also be formed over the interconnect structure, and formed in a passivation layer, which is formed of a non-low-k dielectric layer.

Figure 2:
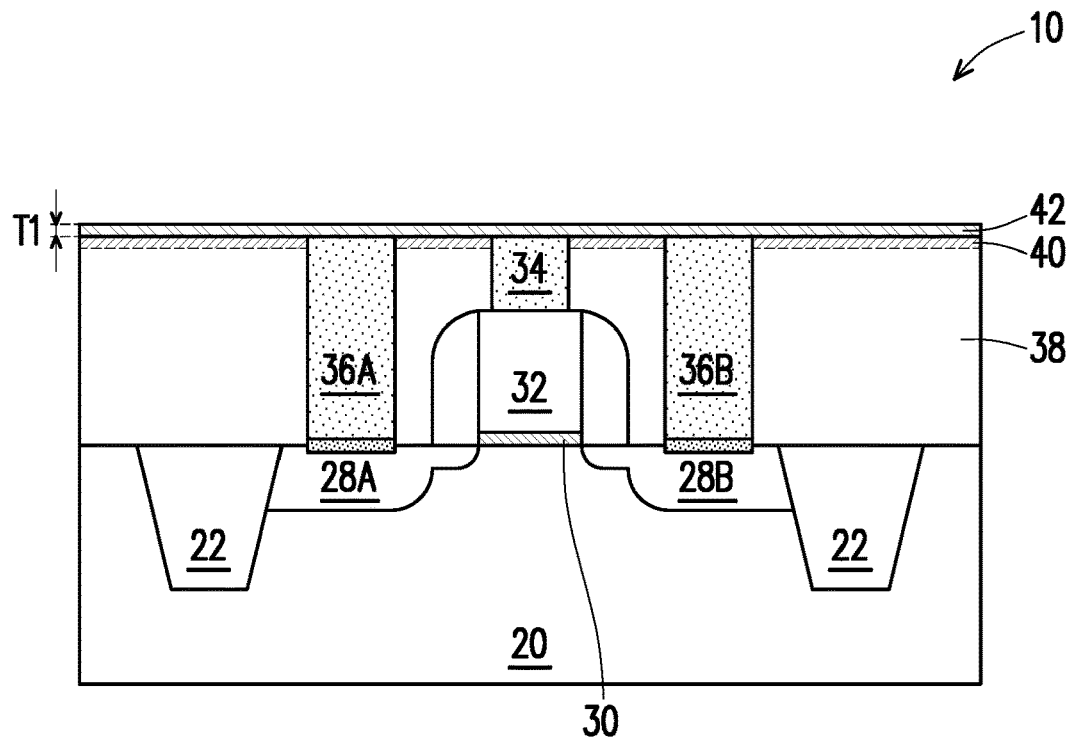
Figure 16:
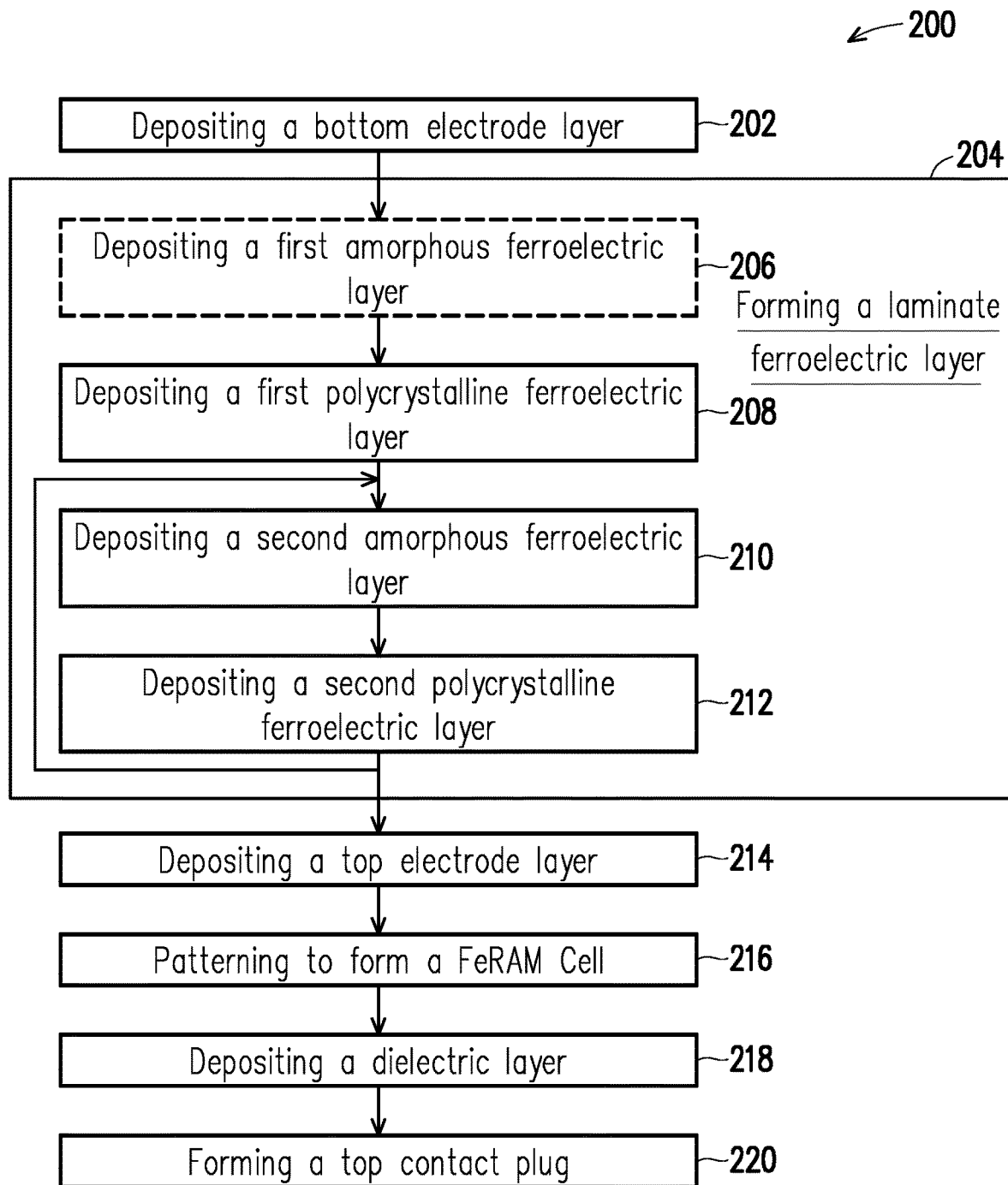
FIG. 16 illustrates a process flow for forming a FeRAM cell including a laminated ferroelectric layer in accordance with some embodiments.

Referring to FIG. 2, bottom electrode layer 42 is deposited. The respective process is illustrated as process 202 in the process flow 200 as shown in FIG. 16. Bottom electrode layer 42 comprises a conductive material, which includes, and is not limited to, W, TaN, TiN, Ti, Ru, Pt, Ir, or the like, alloys thereof, and/or composite layers thereof. The thickness T1 of bottom electrode layer 42 may be in the range between about 100 Å and about 500 Å.

Figure 3:
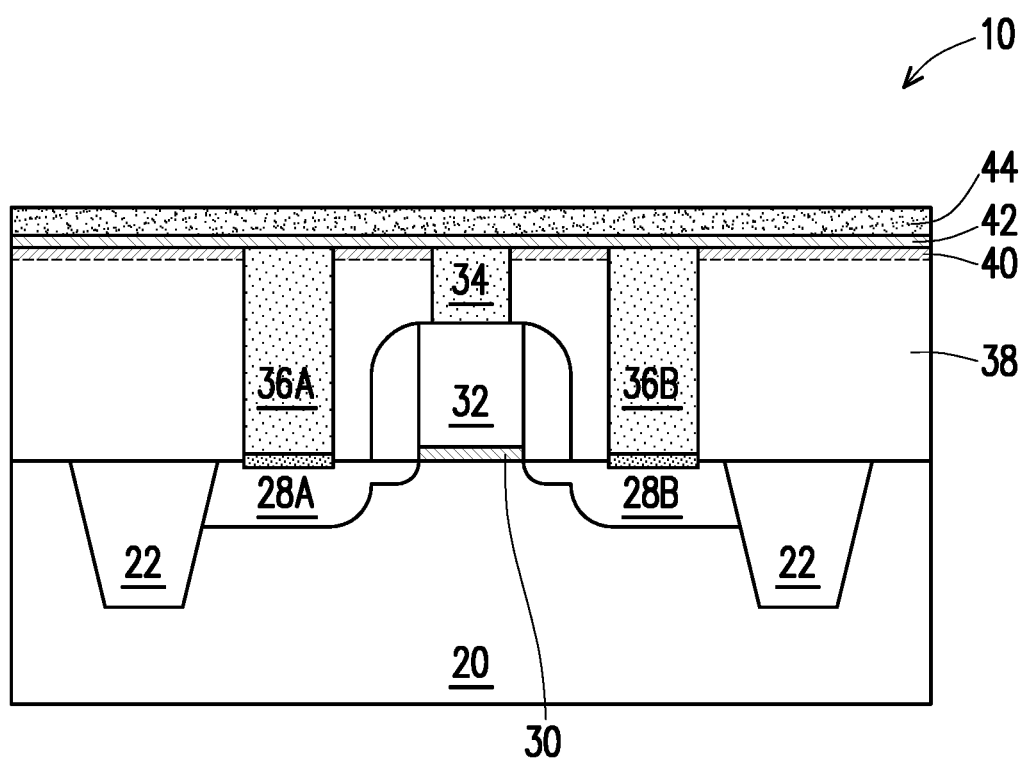

Referring to FIG. 3, laminated ferroelectric layer 44 is deposited on bottom electrode layer 42. The respective process is illustrated as process 204 in the process flow 200 as shown in FIG. 16. In FIG. 3, laminated ferroelectric layer 44 is illustrated schematically, and the details for forming laminated ferroelectric layer 44 is illustrated in detail in FIGS. 7A, 7B, 8A, 8B, 9A, 9B, 10A, and 10B.

Figure 7A:
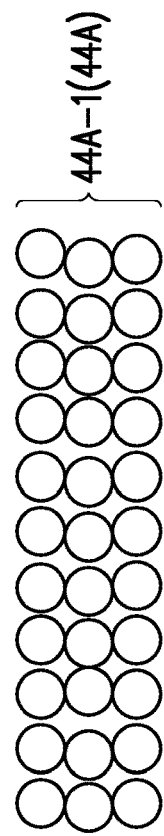
Figure 7B:
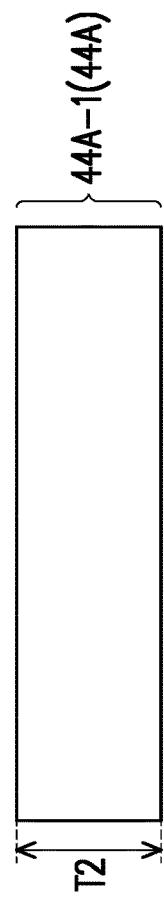

Referring to FIGS. 7A and 7B, ferroelectric layer 44A-1 is deposited in accordance with some embodiments. The respective process is illustrated as process 206 in the process flow 200 as shown in FIG. 16. In accordance with alternative embodiments of the present disclosure, the deposition of ferroelectric layer 44A-1 is skipped, and ferroelectric layer 44P-1 (FIG. 8A) is deposited directly on bottom electrode layer 42 (FIG. 3). Accordingly, process 206 is shown in a dashed frame in FIG. 16 to indicate this process may be, or may not be, performed. FIG. 7A schematically illustrates the atomic layers of ferroelectric layer 44A-1, with one row of circles representing a row of molecules in ferroelectric layer 44A-1. It is appreciated that the arrangement of the circles does not mean there are lattice structures in ferroelectric layer 44A-1. Rather, the arrangement is used to represent the atomic layer(s) of ferroelectric layer 44A-1. FIG. 7B is drawn to show that there is no crystalline structure and there is no grain in ferroelectric layer 44A-1. In accordance with some embodiments of the present disclosure, ferroelectric layer 44A-1 is formed of or comprises a high-k dielectric material, which may also be a ferroelectric material. The deposition may be performed using Atomic Layer Deposition (ALD), which is capable of accurately control how many atomic layers of the ferroelectric layer is formed, and hence is capable of accurately control the thickness of ferroelectric layer 44A-1. In accordance with alternative embodiments, other deposition methods such as Chemical vapor Deposition (CVD) is used. The process of these embodiments is controlled to achieve a desirable thickness.

In accordance with some embodiments, before the deposition process of ferroelectric layer 44A-1 is started, the temperature of wafer 10 (FIG. 3) is adjusted to a desirable wafer temperature, which may be in the range between about 250° C. and about 300°. The material of ferroelectric layer 44A-1 is selected to have a first crystallization temperature CTemp1 higher than the wafer temperature. For example, a hafnium oxide based material such as HfOx (hafnium oxide ($HfO_2$) or HfO) may be used to form ferroelectric layer 44A-1, and other ferroelectric materials having crystallization temperatures higher than the wafer temperature may also be used. For example, ferroelectric materials such as silicon oxide (SiOx), aluminum oxide (AlOx), yttrium oxide ($Y_2O$), or the like may also be used.

In accordance with some embodiments in which ALD is used for depositing $HfO_2$ as ferroelectric layer 44A-1, the precursor may include a Hf-containing precursor such as Tetrakis(ethylmethylamino) hafnium (TEMAH), and an oxidant such as ozone ($O_3$), oxygen ($O_2$), water vapor ($H_2O$), or the like. The deposition may include one or a plurality of ALD cycles, with one atomic layer of $HfO_2$ being deposited in each of the ALD cycles. For good isolation ability for preventing the grains (if any) in the underlying bottom electrode layer 42 from growing into the overlying layers, as will be discussed in subsequent paragraphs, there may be about three or more atomic layers of ferroelectric layer 44A-1 formed. In accordance with some embodiments, each ALD cycle includes pulsing the TEMAH into a reaction chamber in a production tool, purging the TEMAH, for example, using nitrogen ($N_2$) or another inert gas, pulsing the oxidant, and purging the oxidant. Accordingly, the resulting ferroelectric layer 44A-1 may include about 3 atomic layers, and possibly a plurality of (such as 4, 5, 6, or more) atomic layers. The thickness T2 of ferroelectric layer 44A-1 may be in the range between about 5 Å and about 30 Å.

Since the wafer temperature is lower than the crystalline temperature of ferroelectric layer 44A-1, ferroelectric layer 44A-1 is formed as an amorphous layer, and no grain or substantially no grain is formed in ferroelectric layer 44A-1. To ensure that there is no grain formed in ferroelectric layer 44A-1, the wafer temperature may be lower than the crystallization temperature of ferroelectric layer 44A-1 by a difference greater than about 25° C. or 50° C., or example.

Referring to FIGS. 8A and 8B, polycrystalline ferroelectric layer 44P-1 is deposited. The respective process is illustrated as process 208 in the process flow 200 as shown in FIG. 16. FIG. 8A schematically illustrates the atomic layers of ferroelectric layer 44A-1. FIG. 8B is drawn to show the grains 43-1 in ferroelectric layer 44A-1. In accordance with some embodiments of the present disclosure, ferroelectric layer 44P-1 is formed of or comprises a high-k dielectric material, which is a ferroelectric material. The deposition may also be performed using ALD, while other deposition methods such as CVD may also be used.

In accordance with some embodiments, the deposition of ferroelectric layer 44P-1 is performed at a same wafer temperature as for depositing ferroelectric layer 44A-1, which may be, for example, in the range between about 250° C. and about 300°. The material of ferroelectric layer 44P-1 is selected to have a second crystallization temperature CTemp2 lower than the wafer temperature. For example, zirconium oxide ($ZrO_2$), which has the crystallization temperature in the range between about 200° C. and about 250° C., may be used to form ferroelectric layer 44P-1, and other ferroelectric materials having crystallization temperatures lower than the wafer temperature may also be used. For example, ferroelectric materials such as ZrOx, SiOx, TaOx, AlOx, TiOx, YOx, GdOx, LaOx, SrOx, or the like, and combinations thereof, may also be used.

In accordance with alternative embodiments, the wafer temperature is increased when transitioning from the deposition of ferroelectric layer 44A-1 to the deposition of ferroelectric layer 44P-1, so that ferroelectric layer 44P-1 is deposited at a higher temperature than the deposition of layer 44A-1. This may ensure the formation of the grains in ferroelectric layer 44P-1.

In accordance with some embodiments in which ALD is used for depositing ZrOx for ferroelectric layer 44P-1, the precursor may include a Zr-containing precursor such as tetrakis(dimethylamido)zirconium ($Zr(NMe_2)_4$), tetrakis(ethylmethylamido)zirconium $Zr(NMeEt)_4$, or tetrakis(diethylamido)zirconium $Zr(NEt_2)_4$, and an oxidant such as ozone ($O_3$), oxygen ($O_2$), water vapor ($H_2O$), or the like. The deposition includes a plurality of ALD cycles, with one atomic layer of ferroelectric layer 44P-1 being deposited in each of the ALD cycles. In accordance with some embodiments, each ALD cycle includes pulsing the Zr-containing precursor into the reaction chamber, purging the Zr-containing precursor, pulsing the oxidant, and purging the oxidant. Accordingly, the resulting ferroelectric layer 44P-1 includes a plurality of atomic layers. The total number of atomic layers and the corresponding thickness of ferroelectric layer 44P-1 is discussed in subsequent paragraphs. In accordance with some embodiments, the total ALD cycle number of ferroelectric layer 44p-1 is greater than the total ALD cycle number of ferroelectric layer 44A-1. In accordance with alternative embodiments, the total ALD cycle number of ferroelectric layer 44P-1 is equal to or smaller than the total ALD cycle number of ferroelectric layer 44A-1.

With the wafer temperature being higher than the crystalline temperature of ferroelectric layer 44P-1, ferroelectric layer 44P-1 is formed as having a polycrystalline structure including a plurality of grains 43-1. To ensure that grains are formed in ferroelectric layer 44P-1, the crystallization temperature of ferroelectric layer 44P-1 may be lower than the wafer temperature by a difference greater than about 20° C., for example.

FIG. 7B schematically illustrates the grains 43-1 formed in ferroelectric layer 44P-1. In accordance with some embodiments, some of grains 43-1 have heights H1 equal to the thickness T3 of ferroelectric layer 44P-1, which means that these grains expand throughout the growth of ferroelectric layer 44P-1. There may be some grains 43-1 have grain height smaller than the thickness T3 also.

In accordance with some embodiments, the selection and the formation of ferroelectric layer 44A-1 and ferroelectric layer 44P-1 include selecting two ferroelectric materials having crystalline temperatures CTemp1 and CTemp2, respectively, with crystalline temperature CTemp1 being higher than crystalline temperature CTemp2. Furthermore, the material of ferroelectric layer 44A-1 and ferroelectric layer 44P-1 are selected so that the difference (CTemp1-CTemp2) of their crystalline temperatures is great enough, for example, greater than about 50 degrees, or in the range between about 50° C. and about 300° C. The wafer temperature for depositing ferroelectric layer 44A-1 and ferroelectric layer 44P-1 is selected to be lower than crystalline temperature CTemp1 and higher than crystalline temperature CTemp2 with adequate spread from both of temperatures CTemp1 and Ctemp2, so that ferroelectric layer 44A-1 does not have grains, while ferroelectric layer 44P-1 has the grains.

Figure 13:
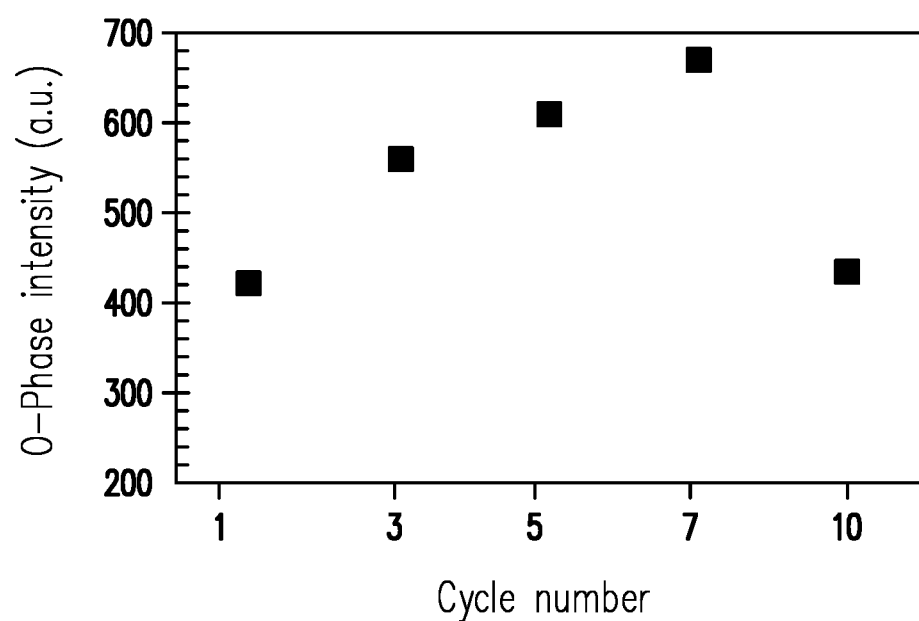
FIG. 13 illustrates the O-phase intensity of a ferroelectric layer as a function of the number of Atomic Layer Deposition (ALD) cycles in accordance with some embodiments.

FIG. 13 illustrates the orthorhombic phase (O-phase) intensity of a polycrystalline ferroelectric layer as a function of the number of atomic layers therein. The Y-axis represents the O-phase intensity, and the X-axis represents the total number of atomic layers (which correspond to the thickness of the ferroelectric layer). It is appreciated that with the increase in the number of atomic layers, grain size will also increase since the grains may expand throughout the entire thickness of ferroelectric layer, as revealed by FIG. 8B. FIG. 13 reveals that with the increase in the number of atomic layers, for example, when the number increases from 1 to 7, the O-phase peak intensity (the peak position of orthorhombic phase measured (ferroelectric phase) at 30.4 degrees) increases accordingly, which means that stronger currents may be induced by switching ferroelectric dipoles. The performance of the resulting FeRAM is improved with the increase of the number of atomic layers due to the increase of the currents, as revealed by FIGS. 14 and 15. For example, the O-phase peak intensity of a ferroelectric layer having 7 atomic layers is 59 percent higher than the O-phase peak intensity of a ferroelectric layer having one atomic layer.

Figure 14:
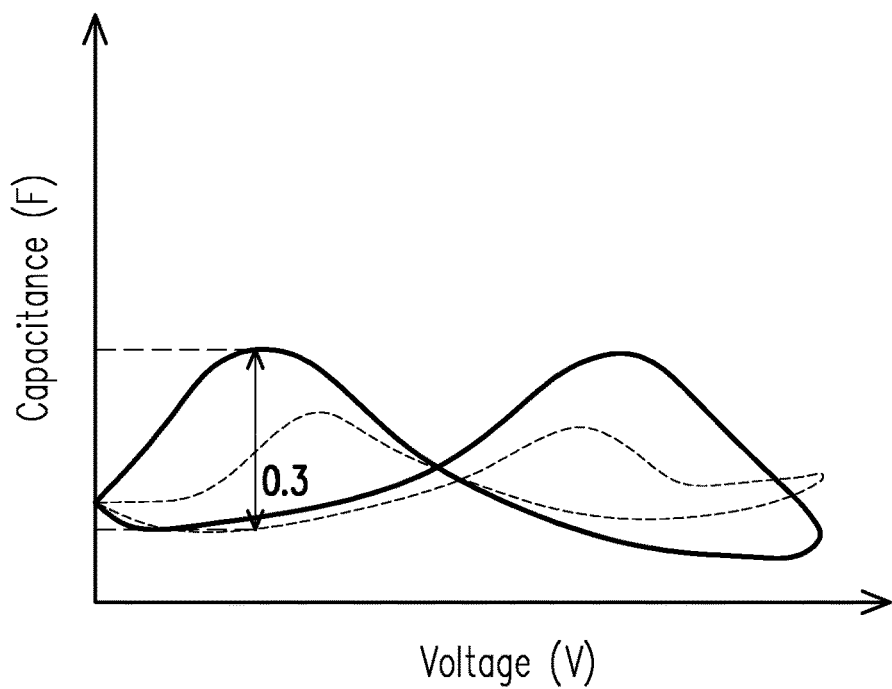
FIGS. 14 and 15 illustrate the comparison of CV curves of a homogeneous ferroelectric layer and a laminated ferroelectric layer, respectively, in accordance with some embodiments.
Figure 15:
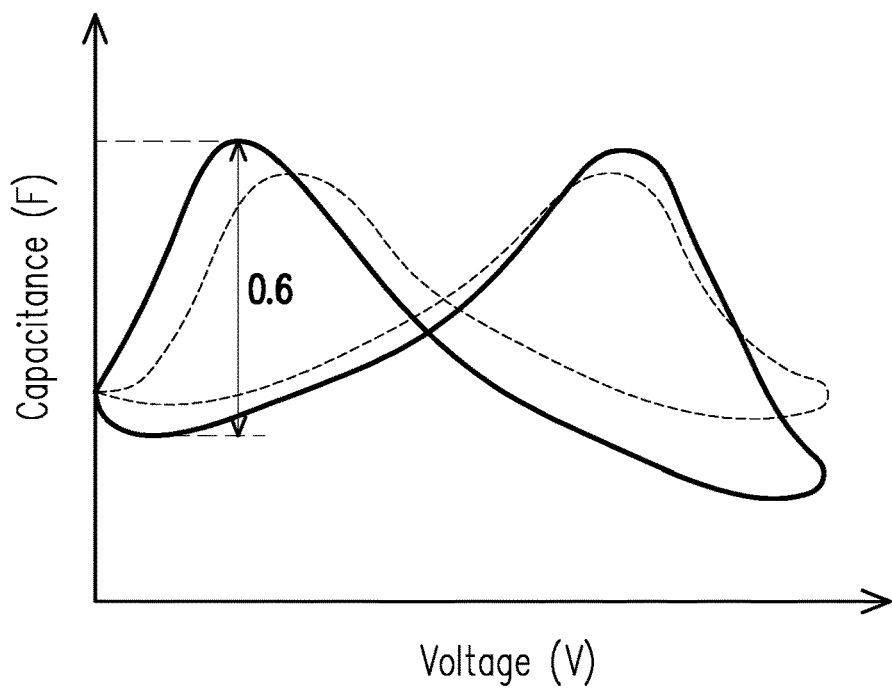

FIGS. 14 and 15 illustrate the comparison of the CV curves of two FeRAMs. The CV curve shown in FIG. 14 is obtained from a sample with a single atomic layer of ferroelectric material. The capacitance of the FeRAM in FIG. 14 is about 0.3E-11 Farad. The CV curve shown in FIG. 15 is obtained from a sample with five atomic layer of ferroelectric material. The capacitance of the FeRAM in FIG. 15 is about 0.6E-11 Farad, which is almost 100 percent improvement over the sample shown in FIG. 14. This reveals that increasing the thickness of the ferroelectric material from one atomic layer to five atomic layers has significant results in improving the performance of FeRAM.

Referring back to FIG. 13, when the number of atomic layers increases to a certain level, for example, around 10 (or some number between 7 and 10), the O-phase peak intensity drops back. This reveals that the grain size cannot be too large. Throughout the description, the thickness of a ferroelectric layer having maximized O-phase peak intensity is referred to as a threshold thickness, and if the thickness of the ferroelectric layer exceeds the threshold thickness, the O-phase intensity will drop adversely. Correspondingly, the number of atomic layers corresponding to the threshold thickness is referred to as a threshold count of atomic layers, and if the number of atomic layers exceeds the threshold count, the O-phase intensity will also drop adversely. Accordingly, in accordance with the embodiments of the present disclosure, means are taken to limit the grain size by limiting the number of atomic layers and the thickness of ferroelectric layer 44P-1 to be equal to or lower than the respective threshold count and threshold thickness. In accordance with some embodiments, depending on the material, the number of atomic layers in ferroelectric layer 44P-1 is equal to or smaller than 10, and may be smaller than about 7, and may be in the range between about 5 and about 7. When viewing from the thickness point of view (rather than from the view-point of the number of atomic layers), thickness T3 (FIG. 8B) of ferroelectric layer 44P-1 may be selected to be smaller than about 20 Å, and may be in the range between about 1 Å and about 15 Å. In accordance with some embodiments, limiting the size of grains 43-1 is achieved by depositing an amorphous ferroelectric layer on ferroelectric layer 44P-1, as shown in FIGS. 9A and 9B, in order to end the growth of the grains.

Referring to FIGS. 9A and 9B, ferroelectric layer 44A-2 is deposited. The respective process is illustrated as process 210 in the process flow 200 as shown in FIG. 16. In accordance with some embodiments, ferroelectric layer 44A-2 is formed of a same material as, or different from the material of ferroelectric layer 44A-1. In accordance with some embodiments, ferroelectric layer 44A-2 is formed of or comprises HfOx. Furthermore, the wafer temperature for depositing ferroelectric layer 44A-2 may be the same as, or different from, the wafer temperatures for depositing ferroelectric layers 44A-1 and 44P-1. The wafer temperature for depositing ferroelectric layer 44A-2 is lower than the crystallization temperature of the material of ferroelectric layer 44A-2. Accordingly, ferroelectric layer 44A-2 is deposited as an amorphous layer, and the grains in ferroelectric layer 44P-1 do not grow into ferroelectric layer 44A-2. The deposition of ferroelectric layer 44A-2 may be performed using ALD, CVD, or the like. Throughout the description, when a grain is referred to as "growing" from a first layer into a second layer, it means that the lattice arrangement in the first layer is carried into the second layer, although the first layer and the second layer are formed of different materials.

Since ferroelectric layer 44A-2 is amorphous, grains 43-1 (FIG. 9B) are terminated where ferroelectric layer 44P-1 meets ferroelectric layer 44A-2. The grain size of grains 43-1 is thus limited. To effectively stop the grain growth from extending into the ferroelectric layer 44P-2, which will be deposited over ferroelectric layer 44A-2, ferroelectric layer 44A-2 needs to have certain thickness, for example, about three atomic layers or more. On the other hand, ferroelectric layer 44A-2 tends to form monoclinic phase, and does not contribute to inducing current for the FeRAM. The thickness T4 of ferroelectric layer 44A-2 thus cannot be too large, and may be smaller than about 5 atomic layers because the extra atomic layers more than the layers needed for stopping grain growth are wasted functional wise. It is realize that one atomic layer or sometimes two atomic layers of ferroelectric layer 44A-2 may not be enough to stop the growth of grains. Accordingly, the thickness T4 of ferroelectric layer 44A-2 may be equal to or greater than about 3 atomic layers (about 2 Å), and may be in the range between about 3 atomic layers (about 2 Å) and about 18 atomic layers (about 13 Å).

After the deposition of ferroelectric layer 44A-2, ferroelectric layer 44P-2 is deposited. The respective process is illustrated as process 212 in the process flow 200 as shown in FIG. 16. In accordance with some embodiments, ferroelectric layer 44P-2 is formed of a same material as ferroelectric layer 44P-1. For example, ferroelectric layer 44P-2 may be formed of or comprises a material selected from the same group of candidate materials for depositing ferroelectric layer 44P-1, and the material may include ZrOx, SiOx, TaOx, AlOx, TiOx, Yox, GdOx, LaOx, SrOx, or the like, or combinations thereof.

Furthermore, the wafer temperature for depositing ferroelectric layer 44P-2 may be the same as, or different from, the wafer temperatures for depositing ferroelectric layers 44A-1, 44P-1, and 44A-2. The wafer temperature for depositing ferroelectric layer 44P-2 is also higher than the crystallization temperature of the material of ferroelectric layer 44P-2. Accordingly, ferroelectric layer 44P-2 is deposited as a polycrystalline layer. The grains 43-2 in ferroelectric layer 44P-2 are schematically illustrated in FIG. 9B. Grains 43-2 are physically separated from grains 43-1 by amorphous ferroelectric layer 44A-2.

The deposition of ferroelectric layer 44P-2 may be performed using ALD, CVD, or the like. When ALD is used, the total count of ALD cycles may be close to, and is equal to or lower than the respective threshold count. For example, the number of ALD cycles may be equal to about 7 or lower, and may be, for example, in the range between about 5 and about 7. The thickness of ferroelectric layer 44P-2 is controlled to be equal to or lower than the threshold thickness. For example, when CVD is used, which does not have cycles, the threshold thickness is used as criteria to control the deposition process.

It is appreciated that the formation of ferroelectric layer 44A-2 to separate ferroelectric layers 44P-2 from ferroelectric layers 44P-1 effectively controlled the growth of grains in ferroelectric layers 44P-1 to be at a desirable size, with the height of the grains being equal to or smaller than the thickness T3 of ferroelectric layers 44P-1. Alternatively stated, the grains of ferroelectric layers 44P-2 are restarted, rather than expanding from the grains of ferroelectric layers 44P-1. This also allows the control of the grain size of ferroelectric layers 44P-2.

Throughout the description of the present disclosure, an amorphous ferroelectric layer and a polycrystalline ferroelectric layer are collectively referred to as a composite ferroelectric layer. The formation of the composite ferroelectric layer is referred to as a composite deposition cycle. FIG. 9A illustrates two composite ferroelectric layers, with the first composite ferroelectric layer comprising ferroelectric layers 44A-1 and 44P-1, and the second composite ferroelectric layer comprising ferroelectric layers 44A-2 and 44P-2. The first and the second composite ferroelectric layers are further laminated with more composite ferroelectric layers, so that the resulting laminate ferroelectric layer has a greater thickness. The resulting composite laminate ferroelectric layer is referred to as ferroelectric layer 44, as shown in FIG. 3.

FIGS. 10A and 10B illustrate the formation of more composite ferroelectric layer(s). The top composite ferroelectric layer includes ferroelectric layers 44A-n and 44P-n, with n being a sequence number equal to or greater than 3. The process is shown as looping backing to process 210 in the process flow 200 as shown in FIG. 16. Throughout the description, ferroelectric layers 44A-1 through ferroelectric layers 44A-n are also individually and collectively referred to as ferroelectric layers 44A, and ferroelectric layers 44P-1 through ferroelectric layers 44P-n are also individually and collectively referred to as ferroelectric layers 44P. In accordance with some embodiments, number n may be in the range between about 3 and about 6. It is also appreciated that the total number of composite ferroelectric layer may also be 2 or 1, which means that the formation of laminated ferroelectric layer 44 (FIG. 3) may be finished when the process shown in FIG. 8A or 9A is finished, or when the process shown in FIG. 10A is finished. The details such as the materials, the formation methods, and the thicknesses of ferroelectric layers 44A-n and the underlying layers 44A may be found referring to that of ferroelectric layers 44A-1 and 44A-2. The details of ferroelectric layers 44P-n and the underlying layers 44P may also be found referring to that of ferroelectric layers 44P-1 and 44P-2.

It is appreciated that in general, increase the thickness of ferroelectric layer 44 may result in increased current of the resulting FeRAM. If the entirety of ferroelectric layer 44 is formed of a homogenous material, however, the grains in ferroelectric layer 44 will also increase with the increase of ferroelectric layer 44, and eventually exceeds the threshold thickness. The effect in FIG. 13 will thus occur. This means the thickness of ferroelectric layer 44 has a cap, so is the increase in the current of the FeRAM through increasing the thickness. In the embodiments of the present disclosure, the thickness of ferroelectric layer 44 is increased by increasing the number of composite ferroelectric layers, while the grain size is limited by the thickness of the individual laminate ferroelectric layer. Accordingly, in the example shown in FIGS. 10A and 10B, there are n ferroelectric layers 44P, and the induced current in the respective FeRAM is determined by the total thickness of the n ferroelectric layers 44P.

In accordance with some embodiments, throughout the formation of the entire ferroelectric layer 44, the temperature of wafer 10 remain unchanged, and the material of 44A (including 44A-1 through 44A-n) and 44P (including 44P-1 through 44P-n) are alternated. Ferroelectric layers 44A-1 through 44A-n may be formed of the same material such as HfOx, and may have the same thickness (number of ALD cycles). Ferroelectric layers 44P-1 through 44P-n may be formed of the same material such as ZrOx, and may have the same thickness (number of ALD cycles). In accordance with alternative embodiments, the wafer temperatures, the materials, and/or the number of ALD cycles (and the thicknesses) in the formation of amorphous ferroelectric layers 44A-1 through 44A-n may be different from each other in any combination, and/or the wafer temperatures, the materials, and/or the number of ALD cycles in the formation of polycrystalline ferroelectric layers 44P-1 through 44P-n may be different from each other in any combination.

In the illustrated embodiments, amorphous ferroelectric layer 44A-1 is shown as the bottom layer in ferroelectric layer 44, and polycrystalline ferroelectric layer 44P-n is the top layer. In accordance with alternative embodiments, each of the bottom layer and the top layer may be an amorphous ferroelectric layer 44A or a polycrystalline ferroelectric layer 44P in any combination, providing amorphous ferroelectric layers and polycrystalline ferroelectric layers are alternated. Depending on the materials, the thickness ratio T3/T4 may be in the range between about 1:1 and about 1:4.

It is also appreciated that the amorphous layers 44A may be formed of a high-k dielectric material or alternatively a non-high-k material, and may be formed of a ferroelectric material or a non-ferroelectric material in accordance with some embodiments, providing the growth of grains in polycrystalline ferroelectric layer 44P is stopped.

Figure 11:
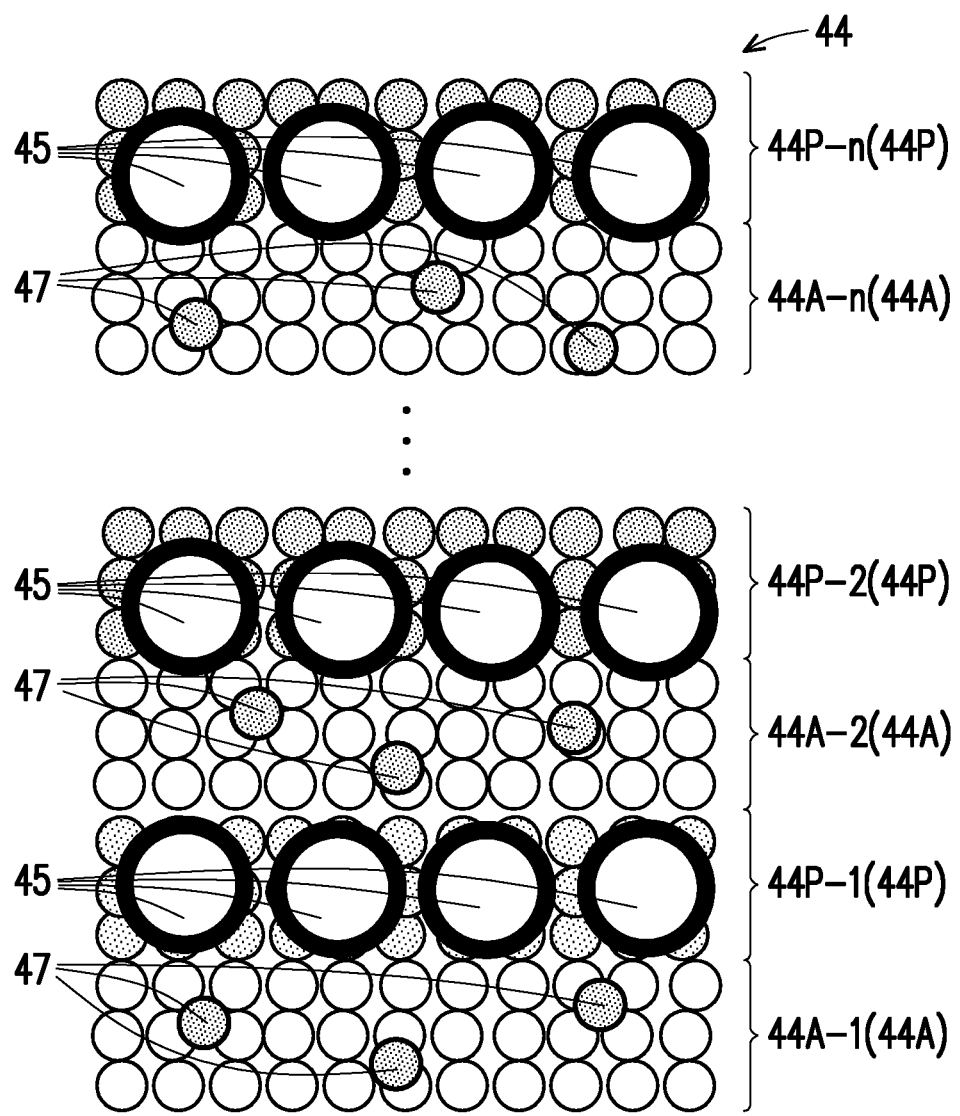
FIG. 11 illustrates the nucleus in the low-crystallization-temperature material in accordance with some embodiments.

FIGS. 11A and 11B illustrate laminate ferroelectric layer 44 also, FIG. 11A is similar to FIG. 10A, except that nucleus 45 are shown in FIG. 11 to represent the growth of grains based on nucleus 45 in ferroelectric layers 44P. The atoms 47 diffused from ferroelectric layers 44P into their neighboring ferroelectric layers 44A are also illustrated schematically.

Figure 12:
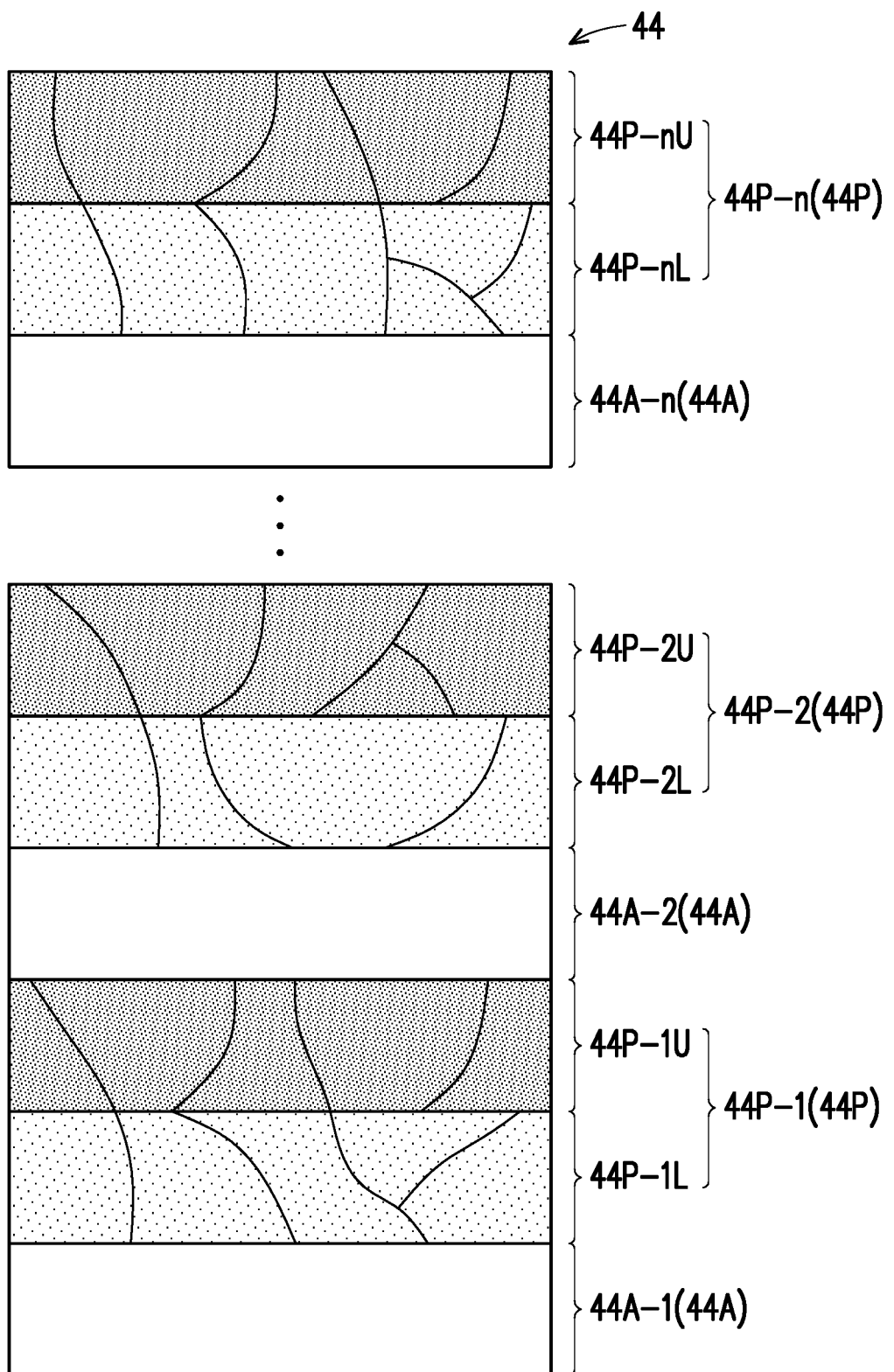
FIG. 12 illustrates a laminated ferroelectric layer including three alternating layers in accordance with some embodiments.

FIG. 12 illustrates ferroelectric layer 44 in accordance with alternative embodiments of the present disclosure. In accordance with some embodiments, ferroelectric layers 44A-1 through 44A-n are essentially the same as the corresponding layers shown in FIGS. 10A and 10B, and hence are not repeated herein. Each of the ferroelectric layers 44P may further include a lower layer (indicated using letter "L") and an upper layer (indicated using letter "U"). For example, ferroelectric layer 44P-1 includes lower layer 44P-1L and 44P-1U. Ferroelectric layers 44P-1L and 44P-1U are discussed herein as an example, and the details of other layers such as 44P-2L and 44P-2U through 44P-nL and 44P-nU may also be conceived from the discussion of ferroelectric layers 44P-1L and 44P-1U.

Both of ferroelectric layers 44P-1L and 44P-1U have crystallization temperatures lower than the wafer temperature of wafer 10 (FIG. 3). Accordingly, both of ferroelectric layers 44P-1L and 44P-1U have polycrystalline structures with grains formed therein. The materials of ferroelectric layers 44P-1L and 44P-1U are different from each other, and each of ferroelectric layers 44P-1L and 44P-1U may be formed of or comprise a material selected from ZrOx, SiOx, TaOx, AlOx, TiOx, YOx, GdOx, LaOx, SrOx, or the like, or combinations thereof, while other materials may also be used. The grains formed in ferroelectric layer 44P-1L may or may not extend into ferroelectric layer 44P-1U. Accordingly, as shown in FIG. 12, some grains may extend from the bottom of ferroelectric layer 44P-1L to the top of ferroelectric layer 44P-1U. Some other grains may be limited in ferroelectric layer 44P-1L and ferroelectric layer 44P-1U. For example, some grains may extend from the bottom of, and terminate at the top of, ferroelectric layer 44P-1L, while some other grains may extend from the bottom of, and terminate at the top of, ferroelectric layer 44P-1U. The total number of atomic layers in ferroelectric layer 44P-1L and ferroelectric layer 44P-1U may be equal to or smaller than the threshold count, and may be in the range between about 5 and 7. In accordance with some embodiments, ferroelectric layer 44P-1L has a lower crystallization temperature than ferroelectric layer 44P-1U, so that grains may be established well in ferroelectric layer 44P-1L, which leads to a better grain growth in ferroelectric layer 44P-1U, which has a higher crystallization temperature. In accordance with some embodiments, ferroelectric layer 44P-1L has a same or higher crystallization temperature than ferroelectric layer 44P-1U.

Figure 4:
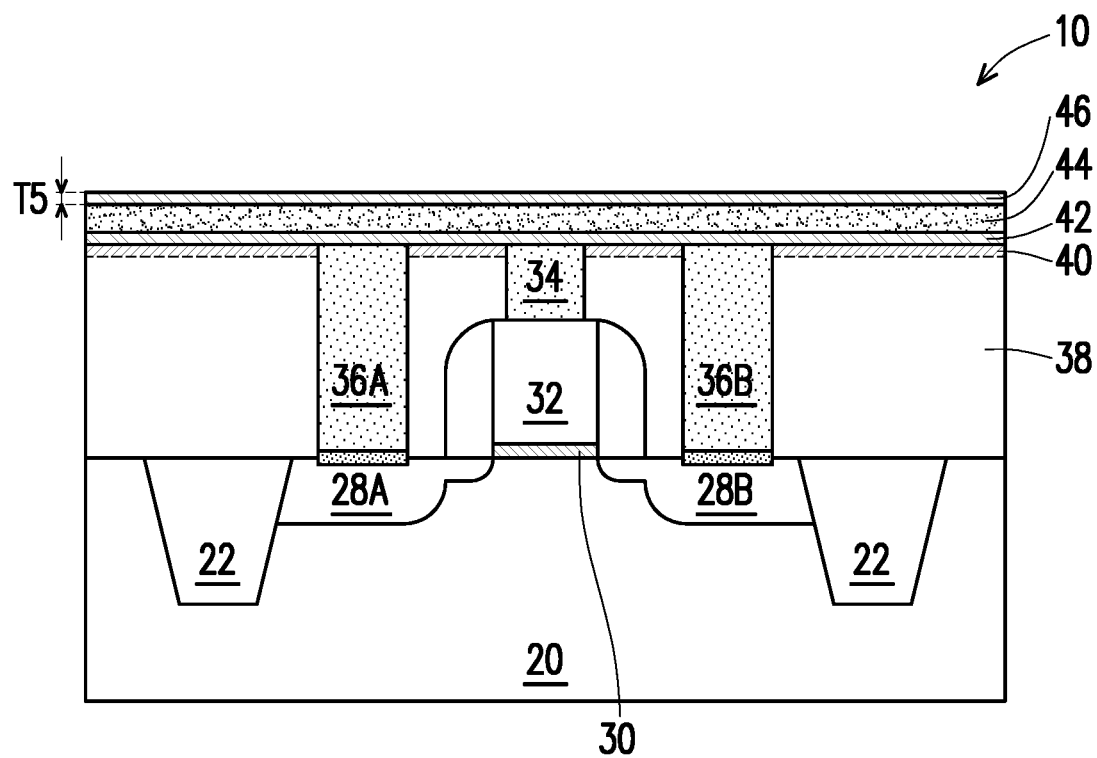

Referring to FIG. 4, after the formation of laminate ferroelectric layer 44, as discussed in preceding paragraphs, top electrode layer 46 is deposited on bottom electrode layer 42. The respective process is illustrated as process 214 in the process flow 200 as shown in FIG. 16. Top electrode layer 46 comprises a conductive material, which includes, and is not limited to, W, TaN, TiN, Ti, Ru, Pt, Ir, or the like, alloys thereof, and/or composite layers thereof. The thickness T5 of top electrode layer 46 may be in the range between about 100 Å and about 500 Å.

Figure 5:
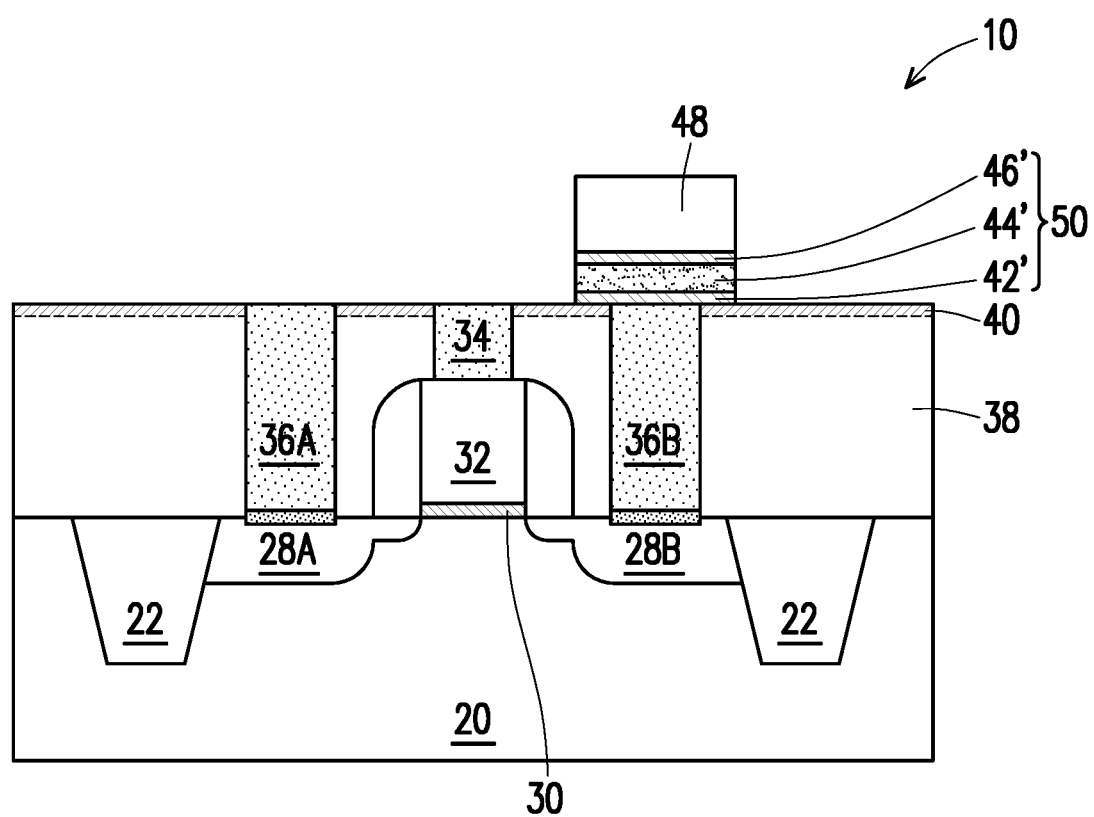

A patterning process is then performed to pattern top electrode layer 46, laminate ferroelectric layer 44, and bottom electrode layer 42. The respective process is illustrated as process 216 in the process flow 200 as shown in FIG. 16. In accordance with some embodiments, as shown in FIG. 5, etching mask 48, which may comprise a photo resist, is applied and patterned. Etching mask 48 is then used to etch top electrode layer 46, ferroelectric layer 44, and bottom electrode layer 42. The etching may be performed using layer 40 as an etch stop layer, or dielectric layer 38 as an etch stop layer if layer 40 is not formed. After the etching process, etching mask 48 is removed. The remaining portions of top electrode layer 46, laminate ferroelectric layer 44, and bottom electrode layer 42 are referred to as top electrode 46', laminate ferroelectric layer 44', and bottom electrode 42', respectively, which are collectively referred to as FeRAM cell 50. At the same time FeRAM cell 50 is formed, an array of FeRAM cells arranged as a plurality of rows and columns, which have identical structures as FeRAM cell 50, may be formed.

Figure 6:
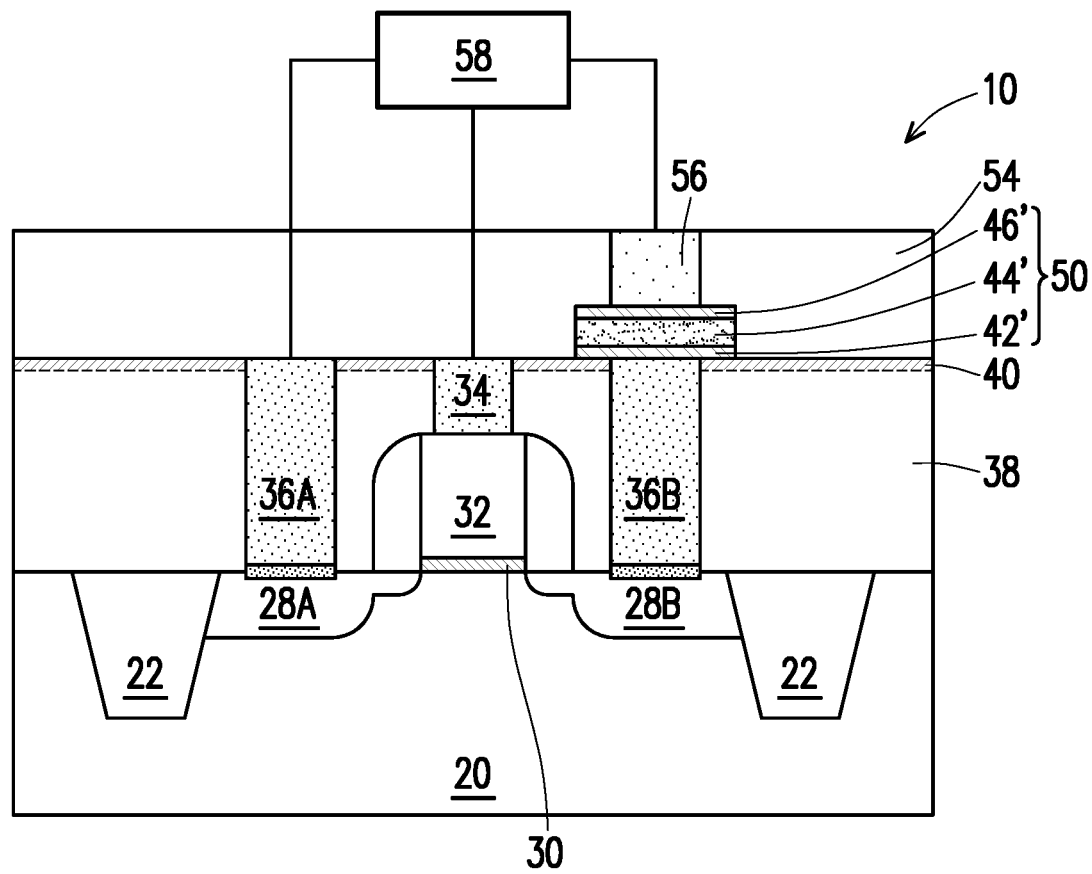

FIG. 6 illustrates the formation of dielectric layer 54, which encircles FeRAM cell 50, and further includes a portion covering FeRAM. The respective process is illustrated as process 218 in the process flow 200 as shown in FIG. 16. In accordance with some embodiments, dielectric layer 54 is formed of or comprises silicon oxide, silicon nitride, silicon oxynitride, a low-k dielectric layer, or the like. Contact plug 56 is formed over and contacting top electrode 46'. The respective process is illustrated as process 220 in the process flow 200 as shown in FIG. 16. Contact plug 56 may be formed of or comprise titanium, titanium nitride, tantalum, tantalum nitride, tungsten, copper, or the like, and composite layers thereof.

FIG. 6 further includes a control circuit 58 electrically connected to FeRAM cell 50. Control circuit 58 comprises circuits for applying appropriate voltages and currents for operating FeRAM cell 50, and perform the read and write operations for FeRAM cell 50. For a write operation, control circuit 58 charges the laminate ferroelectric layer 44 by applying an electrical field, thus forcing the atoms inside the ferroelectric layer 44 into the "up" or "down" orientation (depending on the polarity of the charge), thereby storing a "1" or "0". In a reading operation of FeRAM cell 50, control circuit 58 forces the FeRAM cell 50 into a selected state, for example, "0". If FeRAM cell 50 already held a "0", no pulse will be generated. If FeRAM cell 50 held a "1", the re-orientation of the atoms in the ferroelectric layer 44 will cause a brief pulse of current. Control circuit 58 read the state of FeRAM cell 50 by determining whether this pulse is present or not, and if the pulse is detected, it means FeRAM cell 50 held a "1". Since this process overwrites the FeRAM cell 50, reading FeRAM cell 50 is a destructive process, and control circuit 58 further writes FeRAM cell 50 back to "1".

The embodiments of the present disclosure exhibit improved device performance. A first sample FeRAM cell with a homogeneous ferroelectric layer and a second sample FeRAM cell with a laminate ferroelectric layer are formed, both having cell size of 0.135 µm. The memory window (MW) of the first sample FeRAM cell is about 0.1 V, while the MW of the second sample FeRAM cell is improved to about 0.5V. The common window of the first sample FeRAM cell is about 0 V, while the common window of the second sample FeRAM cell is improved to about 0.1V. Furthermore, among 31 samples, 9 (30 percent) of the sample FeRAM cells with the homogeneous ferroelectric layers have overlap between erase and program, and are defective. As a comparison, none of the 31 sample FeRAM cells including laminate ferroelectric layers is defective.

The embodiments of the present disclosure have some advantageous features. By increasing the total thickness of the ferroelectric layers with the orthorhombic phase (having the polycrystalline structure), the performance of the resulting FeRAM is improved. The increase in the thickness of the ferroelectric layers, however, may result in the increase in the size of the grains to a threshold thickness that the orthorhombic phase intensity undesirably drops. In accordance with some embodiments of the present disclosure, amorphous ferroelectric layers are formed (by adopting a high-crystallization temperature material) to disrupt the increase of grain size, hence allowing the improvement of the performance of FeRAM through increasing the thickness of the ferroelectric material.

In accordance with some embodiments of the present disclosure, a method includes forming a bottom electrode layer; depositing a first ferroelectric layer over the bottom electrode layer, wherein the first ferroelectric layer is amorphous; depositing a second ferroelectric layer over the first ferroelectric layer, wherein the second ferroelectric layer has a polycrystalline structure; depositing a third ferroelectric layer over the second ferroelectric layer, wherein the third ferroelectric layer is amorphous; depositing a top electrode layer over the third ferroelectric layer; and patterning the top electrode layer, the third ferroelectric layer, the second ferroelectric layer, the first ferroelectric layer, and the bottom electrode layer to form a FeRAM cell. In an embodiment, the first ferroelectric layer and the second ferroelectric layer are deposited at a same wafer temperature. In an embodiment, the method further comprises depositing a fourth ferroelectric layer over the third ferroelectric layer, wherein the fourth ferroelectric layer has an additional polycrystalline structure. In an embodiment, the first ferroelectric layer has a first crystallization temperature, and the second ferroelectric layer has a second crystallization temperature lower than the first crystallization temperature. In an embodiment, the second ferroelectric layer comprises a grain extending from top to bottom of the second ferroelectric layer. In an embodiment, the depositing the first ferroelectric layer and the depositing the second ferroelectric layer comprise depositing different materials. In an embodiment, the depositing the first ferroelectric layer and the depositing the third ferroelectric layer comprise depositing a same material. In an embodiment, the first ferroelectric layer is deposited using ALD, and the depositing the first ferroelectric layer comprises more than about 3 ALD cycles. In an embodiment, the second ferroelectric layer is deposited using ALD, and the depositing the second ferroelectric layer comprises fewer than about 7 ALD cycles.

In accordance with some embodiments of the present disclosure, a device includes a FeRAM cell includes a bottom electrode; a laminate ferroelectric layer comprising a first amorphous ferroelectric layer over the bottom electrode; a first polycrystalline ferroelectric layer over the first amorphous ferroelectric layer; a second amorphous ferroelectric layer over the first polycrystalline ferroelectric layer; and a second polycrystalline ferroelectric layer over the second amorphous ferroelectric layer; and a top electrode over the second polycrystalline ferroelectric layer. In an embodiment, the first amorphous ferroelectric layer, the first polycrystalline ferroelectric layer, the second amorphous ferroelectric layer, and the second polycrystalline ferroelectric layer are high-k dielectric layers. In an embodiment, the first amorphous ferroelectric layer and the first polycrystalline ferroelectric layer comprise different materials. In an embodiment, the first amorphous ferroelectric layer and the second amorphous ferroelectric layer comprise a same material. In an embodiment, each of the first polycrystalline ferroelectric layer and the second polycrystalline ferroelectric layer comprises fewer than about 7 atomic layers. In an embodiment, the second amorphous ferroelectric layer comprises more than about 3 atomic layers. In an embodiment, the first amorphous ferroelectric layer comprises hafnium oxide, and the second amorphous ferroelectric layer comprises zirconium oxide.

In accordance with some embodiments of the present disclosure, a device includes a bottom electrode; a first plurality of ferroelectric layers over the bottom electrode, wherein the first plurality of ferroelectric layers are formed of first materials having first crystallization temperatures; a second plurality of ferroelectric layers over the bottom electrode, wherein the first plurality of ferroelectric layers and the second plurality of ferroelectric layers are stacked alternatingly, and wherein the second plurality of ferroelectric layers are formed of second materials having second crystallization temperatures, and the second crystallization temperatures are lower than the first crystallization temperatures; and a top electrode over the first plurality of ferroelectric layers and the second plurality of ferroelectric layers. In an embodiment, the first plurality of ferroelectric layers are formed of a same material, and the second plurality of ferroelectric layers are formed of a same material. In an embodiment, the first plurality of ferroelectric layers are amorphous layers, and the second plurality of ferroelectric layers are polycrystalline layers. In an embodiment, grains in each of the second plurality of ferroelectric layers are fully separated from additional grains in other ones of the second plurality of ferroelectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a bottom electrode layer;
   depositing a first ferroelectric layer over the bottom electrode layer, wherein the first ferroelectric layer is amorphous;
   depositing a second ferroelectric layer over the first ferroelectric layer, wherein the second ferroelectric layer has a polycrystalline structure;
   depositing a third ferroelectric layer over the second ferroelectric layer, wherein the third ferroelectric layer is amorphous;
   depositing a fourth ferroelectric layer over the third ferroelectric layer, wherein the fourth ferroelectric layer has an additional polycrystalline structure;
   depositing a top electrode layer over the fourth ferroelectric layer; and
   patterning the top electrode layer, the fourth ferroelectric layer, the third ferroelectric layer, the second ferroelectric layer, the first ferroelectric layer, and the bottom electrode layer to form a Ferroelectric Random Access Memory (FeRAM) cell.

2. The method of claim 1, wherein the first ferroelectric layer and the second ferroelectric layer are deposited at a same wafer temperature.

3. The method of claim 1, wherein the first ferroelectric layer has a first crystallization temperature, and the second ferroelectric layer has a second crystallization temperature lower than the first crystallization temperature.

4. The method of claim 1, wherein the second ferroelectric layer comprises a grain extending from top to bottom of the second ferroelectric layer, and wherein a bottom surface and a top surface of the grain is in physical contact with amorphous structures of the first ferroelectric layer and the third ferroelectric layer, respectively.

5. The method of claim 1, wherein the depositing the first ferroelectric layer and the depositing the second ferroelectric layer comprise depositing different materials.

6. The method of claim 1, wherein the depositing the first ferroelectric layer and the depositing the third ferroelectric layer comprise depositing a same material.

7. The method of claim 1, wherein the first ferroelectric layer is deposited using Atomic Layer Deposition (ALD), and the depositing the first ferroelectric layer comprises more than about 3 ALD cycles.

8. The method of claim 1, wherein the second ferroelectric layer is deposited using Atomic Layer Deposition (ALD), and the depositing the second ferroelectric layer comprises fewer than about 7 ALD cycles.

9. A method comprising:
   forming a Ferroelectric Random Access Memory (FeRAM) cell comprising:
      forming a bottom electrode;
      forming a laminate ferroelectric layer comprising:
         forming a first amorphous ferroelectric layer over the bottom electrode;
         forming a first polycrystalline ferroelectric layer over the first amorphous ferroelectric layer;
         forming a second amorphous ferroelectric layer over the first polycrystalline ferroelectric layer; and
         forming a second polycrystalline ferroelectric layer over the second amorphous ferroelectric layer; and
      forming a top electrode over the second polycrystalline ferroelectric layer.

10. The method of claim 9, wherein the first amorphous ferroelectric layer and the first polycrystalline ferroelectric layer comprise different materials.

11. The method of claim 10, wherein the first amorphous ferroelectric layer and the first polycrystalline ferroelectric layer are deposited at a same temperature.

12. The method of claim 11, wherein the same temperature is lower than a first crystallization temperature of the first amorphous ferroelectric layer, and wherein the same temperature is higher than a second crystallization temperature of the first polycrystalline ferroelectric layer.

13. The method of claim 9, wherein the first amorphous ferroelectric layer and the first polycrystalline ferroelectric layer comprise a same material.

14. The method of claim 13, wherein the first amorphous ferroelectric layer and the first polycrystalline ferroelectric layer are deposited at different temperatures.

15. The method of claim 14, wherein the first amorphous ferroelectric layer and the first polycrystalline ferroelectric layer have a same crystallization temperature, and wherein the first amorphous ferroelectric layer is deposited at a first temperature lower than the same crystallization temperature, and the first polycrystalline ferroelectric layer is deposited at a second temperature higher than the same crystallization temperature.

16. A method comprising:
   forming a bottom electrode;
   depositing a first plurality of ferroelectric layers and a second plurality of ferroelectric layers alternatingly over the bottom electrode, wherein the first plurality of ferroelectric layers are formed of first materials having first crystallization temperatures, and the second plurality of ferroelectric layers are formed of second materials having second crystallization temperatures, and wherein the second crystallization temperatures are lower than the first crystallization temperatures; and
   forming a top electrode over the first plurality of ferroelectric layers and the second plurality of ferroelectric layers.

17. The method of claim 16, wherein the first plurality of ferroelectric layers and the second plurality of ferroelectric layers are deposited at a same temperature.

18. The method of claim 17, wherein the same temperature is lower than the first crystallization temperatures and higher than the second crystallization temperatures.

19. The method of claim 16, wherein the first plurality of ferroelectric layers are amorphous layers, and the second plurality of ferroelectric layers are polycrystalline layers.

20. The method of claim 1 further comprising depositing a fifth ferroelectric layer over the fourth ferroelectric layer, wherein the fifth ferroelectric layer is amorphous, and wherein the top electrode layer is further over the fifth ferroelectric layer.

* * * * *